United States Patent [19]

Iwashita

[11] Patent Number: 5,301,152
[45] Date of Patent: Apr. 5, 1994

[54] SEMICONDUCTOR MEMORY DEVICE EQUIPPED WITH SENSE AMPLIFIER CIRCUIT WHICH ELIMINATES A TRANSIENT PULSE AT AN OUTPUT DATA TERMINAL

[75] Inventor: Shinichi Iwashita, Tokyo, Japan

[73] Assignee: NEC Corporation, Tokyo, Japan

[21] Appl. No.: 889,624

[22] Filed: May 28, 1992

[30] Foreign Application Priority Data

May 28, 1991 [JP] Japan .................................. 3-152562

[51] Int. Cl.⁵ .......................... G11C 7/00; G11C 13/00
[52] U.S. Cl. ..................................... 365/190; 365/207; 365/208; 365/189.01
[58] Field of Search ............ 365/190, 207, 208, 189.01

[56] References Cited

U.S. PATENT DOCUMENTS 4,891,792  1/1990  Hanamura et al. ............ 365/189.05
5,029,138  7/1991  Iwashita ............................ 365/208

Primary Examiner—Eugene R. LaRoche
Assistant Examiner—Huan Hoang
Attorney, Agent, or Firm—Sughrue, Mion, Zinn, Macpeak & Seas

[57] ABSTRACT

A sense amplifier circuit incorporated in an electrically programmable read only memory device comprises a differential amplification stage operative to develop a differential voltage level indicative of a read-out data bit for producing a large differential voltage signal, and an output stage having an output inverter variable in threshold level and responsive to the large differential voltage signal for producing an output data signal, and a controller responsive to the output data signal indicative of a previously accessed data bit for varying the threshold level of the output inverter so that the output inverter never produces a transient pulse between sequentially accessed data bits identical in logic level.

8 Claims, 5 Drawing Sheets

SEMICONDUCTOR MEMORY DEVICE EQUIPPED WITH SENSE AMPLIFIER CIRCUIT WHICH ELIMINATES A TRANSIENT PULSE AT AN OUTPUT DATA TERMINAL

FIELD OF THE INVENTION

This invention relates to a semiconductor memory device and, more particularly, to a sense amplifier circuit incorporated in the semiconductor memory device.

DESCRIPTION OF THE RELATED ART

For varying the threshold level between relatively high and relatively low, a floating gate type field effect transistor is known for a non-volatile memory cell array. A non-volatile memory cell assigned to a single data bit may be implemented by a single floating gate type field effect transistor. However, a pair of floating gate type field effect transistors can be used to form, in combination, a single non-volatile memory cell for speeding-up a of read-out operation.

FIG. 1 shows a typical example of an electrically programmable read only memory device with non-volatile memory cells each implemented by a pair of floating gate type field effect transistors. The prior art electrically programmable read only memory device largely comprises a memory cell array 1 associated with word lines WL1 to WLm as cell as with digit line D1a to Dna and D1b to Dnb paired with one another, a row address decoding unit 2 coupled with the word lines WL1 to WLm, a column selecting unit 3 coupled with the digit lines D1a to Dna and D1b to Dnb, a column address decoding unit 4 associated with the column selecting unit 3, and a sense amplifier unit 5. The memory cell array 1 is broken down into two sections. The first section is implemented by floating gate type field effect transistors arranged in rows and columns, and the second section is also implemented by floating gate type field effect transistors arranged in rows and columns. The floating gate type field effect transistors of the first section are respectively paired with the floating gate type field effect transistors of the second section, and two floating gate type field effect transistors paired with each other form in combination a non-volatile memory cell. However, only one non-volatile memory cell M11 implemented by a pair of floating gate type field effect transistors MA11 and MB11 is shown in FIG. 1. A single data bit is memorized in one of the non-volatile memory cells. In order to memorize a data bit into a non-volatile memory cell, one of the floating gate type field effect transistors of the memory cell enters a programmed state with a relatively high threshold level, and the other floating gate type field effect transistor remains in an erased state with a relatively low threshold level. The rows of the first section are associated with the rows of the second section, and the word lines WL1 to WLm are shared between the respective associated rows of the first and second sections. The digit lines D1a to Dna are respectively associated with the columns of the floating gate type field effect transistors of the first section, and the digit lines D1b to Dnb are also associated with the columns of the floating gate type field effect transistors of the second section, respectively. The digit lines D1a to Dna are respectively paired with the digit lines D1b to Dnb so as to form digit line pairs, and, for this reason, a data bit read out from one of the non-volatile memory cells is propagated by the associated digit line pair in the form of differential voltage level.

The column selecting unit 3 is also broken down into first and second sections, and the first and second sections of the column selecting unit 3 are associated with the digit lines D1a to Dna and D1b to Dnb, respectively. The first section of the column selecting unit 3 is implemented by n-channel enhancement type transfer transistors, and other n-channel enhancement type transfer transistors formed in combination with the second section. The n-channel enhancement type transfer transistors of the first section are coupled between the digit lines D1a to Dna and a first input node N1a of the sense amplifier unit 5, and the n-channel enhancement type transfer transistors of the second section are coupled between a second input node N1b of the sense amplifier unit 5 and the digit lines D1b to Dnb. However, only one pair of n-channel enhancement type transfer transistors 3a and 3b are shown in FIG. 1 in association with the digit line pair D1a and D1b. The n-channel enhancement type transfer transistors of the first section are respectively associated with the n-channel enhancement type transfer transistors of the second section, and decoded signal lines DS1 to DSn are shared between the first and second sections of the column selector unit 3. For this reason, when the column address decoding unit 4 drives one of the decoded signal lines DS1 to DSn, a pair of transfer transistors concurrently turn on so as to couple the associated digit line pair with the first and second input nodes N1a and N1b, and a data bit on the digit line pair is relayed to the sense amplifier unit 5.

The sense amplifier unit 5 comprises two inverting circuits 51a and 51b coupled at the input nodes thereof with the first and second input nodes N1a and N1b, two n-channel enhancement type gate transistors 52a and 52b respectively gated by the inverting circuits 51a and 51b, first and second current mirror circuits 53a and 53b coupled between a power voltage source Vdd and the n-channel enhancement gate transistors 52a and 52b, a third current mirror circuit 54 associated with the first and second current mirror circuits 53a and 53b, and an output inverting circuit 55 coupled between the third current mirror circuit 54 and an output data terminal OUT. The first current mirror circuit 53a is implemented by a pair of p-channel enhancement type field effect transistors Qp1 and Qp2, and the gate electrodes of the pair of p-channel enhancement type field effect transistors Qp1 and Qp2 are coupled with the drain node N2a of the p-channel enhancement type field effect transistor Qp1. The amount of current passing through each p-channel enhancement type field effect transistor Qp1 or Qp2 is varied with the voltage level at the drain node N2a, and currents are supplied from the first current mirror circuit 53a to the n-channel enhancement type gate transistor 52a and the third current mirror circuit 54, respectively. Similarly, the second current mirror circuit 53b is implemented by two p-channel enhancement type field effect transistors Qp3 and Qp4, and currents passing through these transistors Qp3 and Qp4 are varied with the voltage level at the drain node N2b of the p-channel enhancement type field effect transistor Qp3. For this reason, the currents are also supplied from the second current mirror circuit 53b to the n-channel enhancement type gate transistor 52b and the third current mirror circuit 54. The third current mirror circuit 54 is implemented by two n-channel enhancement type field effect transistors Qn5 and Qn6 coupled between the p-channel enhancement type field effect transistors Qp2 and Qp4 and a ground voltage line, and the n-channel enhancement type field effect transistors Qn5 and Qn6 are gated by the drain node N3 of the n-channel enhancement type field effect transistor Qn6. Therefore, currents passing through the transistors Qn5 and Qn6 are varied with the voltage level at the drain node N3 of the n-channel enhancement type field effect transistor Qn6, i.e., the amount of current passing through the p-channel enhancement type field effect transistor Qp4, and the voltage level at the drain node N4 of the n-channel enhancement type field effect transistor Qn5 is relayed to the output inverting circuit 55. The voltage level at the drain node N4 of the transistor Qn5 is indicative of a data bit read out from one of the nonvolatile memory cells, and the output inverting circuit 55 produces an output data signal Dout at the output data terminal OUT.

Description is hereinbelow made of the operation of the prior art electrically programmable read only memory device with reference to FIG. 2 on the assumption that row address bits and column address bits are indicative of the non-volatile memory cell M11. The row address decoding unit 2 decodes the row address bits, and the word line WL1 is allowed to go up to active high voltage level. With the column address bits, the column address decoding unit 4 causes the decoded signal line DS1 to go up to the active high voltage level at time t1, and the n-channel enhancement type transfer transistors 3a and 3b concurrently turn on to couple the first and second input nodes N1a and N1b with the digit lines D1a and D1b, respectively. Currents are supplied from the first and second current mirror circuits 53a and 53b through the n-channel enhancement type gate transistors 52a and 52b and the column selector unit 3 to the digit lines D1a and D1b. For this reason, the digit lines D1a and D1b start to have increasing the voltage levels at time t2.

If the accessed data bit is represented by the floating gate type field effect transistor MA11 in the erased state and the floating gate type field effect transistor MB11 in the programmed state, the digit line D1a and, accordingly, the first input node N1a are electrically coupled with the ground voltage line, and the voltage level at the first input node N1a is decayed, and the inverting circuit 51a makes the voltage level at the gate electrode GE1 relatively high. Then, the inverting circuit 51a increases the channel conductance of the n-channel enhancement gate transistor 52a, and the first current mirror circuit 53a maximizes the current supplied to the third current mirror circuit 54. On the other hand, the floating gate type field effect transistor MB11 in the programmed state isolates the digit line D1b from the ground voltage line, and the voltage level at the second input node N1b is increased. The inverting circuit 51b decreases the channel conductance of the n-channel enhancement type gate transistor 52b, and the second current mirror circuit 53b minimizes the amount of current supplied to the third current mirror circuit 54. Therefore, a differential voltage level of tens of millivolts defined between the digit lines D1a and D1b around time t3. The first current mirror circuit 53a increases the current supplied to the third current mirror circuit 54; however, the second current mirror circuit 53b decreases the current to the third current mirror circuit 54. Then, the n-channel enhancement type field effect transistors Qn5 and Qn6 simultaneously decrease the respective channel conductances, and the large amount of current supplied from the first current mirror circuit 53a rapidly elevates the voltage level at the drain node N4. The output inverting circuit 55 produces the output data signal Dout indicative of the accessed data bit, and the output data signal Dout is supplied to the output data terminal OUT.

However, a problem is encountered in that undesirable transient pulse PL is generated at the output data terminal OUT if two data bits sequentially accessed are identical in logic level. In detail, if the previous accessed data bit is identical with the data bit stored in the non-volatile memory cell M11, the drain node N4 is kept in the high voltage level. However, while the previously selected decoded signal line is replaced with the decoded signal line DS1, the voltage level at the drain node N2a is balanced with the voltage level at the drain node N2b, and the drain node N4 or the input node of the output inverting circuit 55 is moved to an intermediate voltage level as shown in FIG. 2. The intermediate voltage level is usually higher than the threshold level of the output inverting circuit 55, and the output inverting circuit 55 shifts the output data signal Dout or the output data terminal OUT to the high voltage level. Upon occurrence of the differential voltage level between the digit lines D1a and D1b, the drain node N4 is recovered to the high voltage level, and the output inverting circuit 55 shifts the output data signal Dout to the low voltage level again. Thus, the voltage level at the output data terminal OUT is transiently lifted to the high voltage level, and the undesirable transient pulse PL is generated place.

If the threshold level of the output inverting circuit 55 is adjusted to a higher level, the transient pulse PL is not generated however, the same problem occurs in the opposite situation, i.e., sequentially accessed data bits of the high voltage level. The transient pulse PL reaches a semiconductor integrated circuit coupled with the prior art semiconductor memory device, and the memory device may malfunction.

SUMMARY OF THE INVENTION

It is therefore an important object of the present invention to provide a semiconductor memory device having a sense amplifier circuit of which which does not generate undesirable transient pulse.

To accomplish these objects, the present invention proposes to vary the threshold level of an output inverter depending upon the logic level of a previously accessed data bit.

In accordance with the present invention, there is provided a semiconductor memory device comprising: a) a memory cell array for storing a plurality of data bits; b) a selecting means associated with the memory cell array, and supplying one of the plurality of data bits to an output port thereof in the form of differential voltage level; and c) a sense amplifier unit having c-1) a differential amplification stage operative to develop differential voltage level indicative of the aforesaid one of the plurality of data bits for producing a large differential voltage signal, and c-2) an output stage having an output inverter variable in threshold level and responsive to the large differential voltage signal for producing an output data signal, and a controller responsive to the output data signal indicative of a previously accessed data bit for changing the threshold level of the output inverter.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENT

Figure 1:
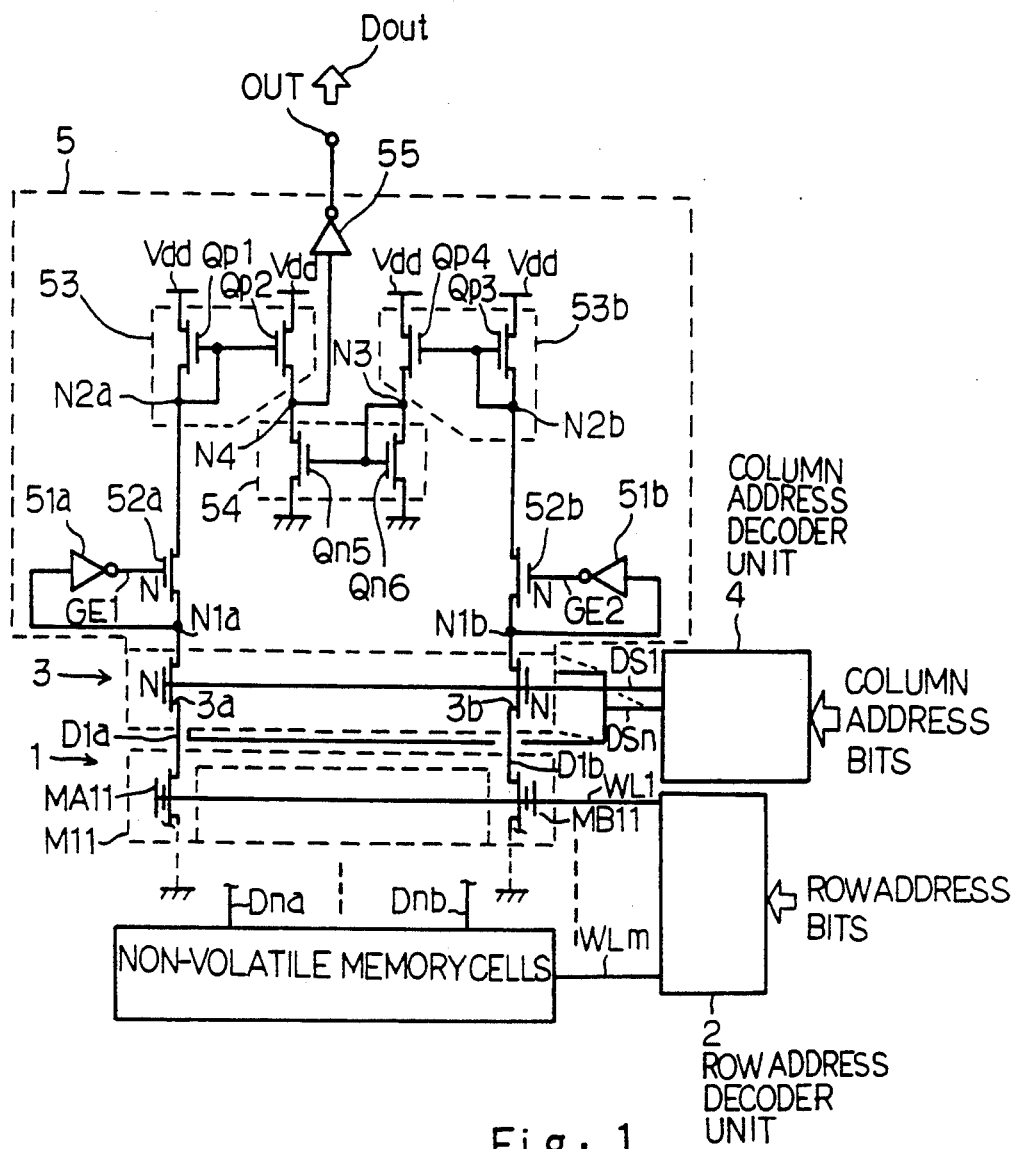
FIG. 1 is a circuit diagram showing the arrangement of the prior art semiconductor memory device.
Figure 2:
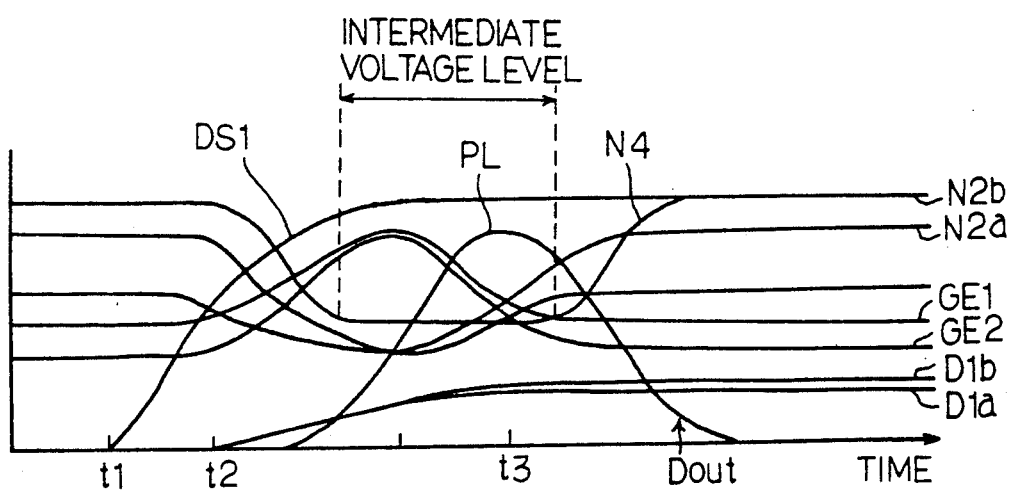
FIG. 2 is a diagram showing the waveforms at essential nodes in the prior art semiconductor memory device.
Figure 3:
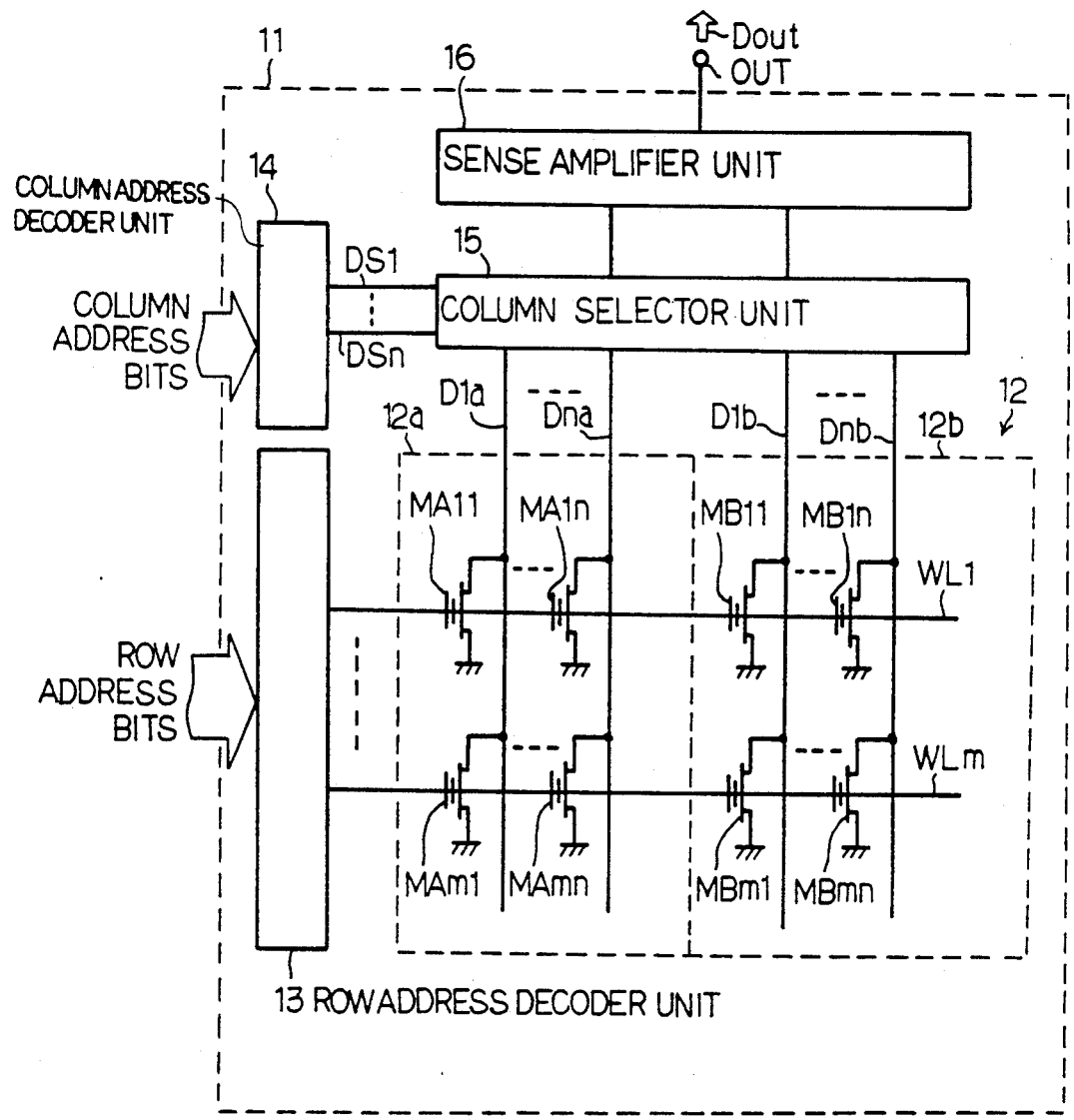
FIG. 3 is a circuit diagram showing the arrangement of a semiconductor memory device according to the present invention.

Referring to FIG. 3 of the drawings, an electrically programmable read only memory device is fabricated on a single semiconductor chip 11, and largely comprises a memory cell array 12, a row address decoder unit 13, a column address decoder unit 14, a column selector unit 15 and a sense amplifier unit 16.

The memory cell array 12 is broken down into two sub-arrays 12a and 12b. The first sub-array 12a is implemented by n-channel enhancement type floating gate type field effect transistors MA11, MA1n, MAm1 and MAmn arranged in rows and columns, and the second sub-array 12b is also implemented by n-channel enhancement type floating gate type field effect transistors MB11, MB1n, MBm1 and MBmn arranged in rows and columns. The rows of the first sub-array 12a are respectively associated with the rows of the second sub-array 12b, and a plurality of word lines WL1 to WLm are shared between the rows of the first sub-array 12a and the rows of the second sub-array 12b. The floating gate type field effect transistors MA11 to MAmn of the first sub-array 12a are respectively paired with the n-channel enhancement type floating gate type field effect transistors MB11 to MBmn of the second sub-section 12b, and two n-channel enhancement type floating gate type field effect transistors paired with each other form in combination a non-volatile memory cell. A single data bit is memorized in one of the non-volatile memory cells of the memory cell array 12. In order to memorize a data bit into a non-volatile memory cell, an n-channel enhancement type floating gate type field effect transistor of either first or second sub-array 12a or 12b enters a programmed state with a relatively high threshold level, and the other n-channel enhancement type floating gate type field effect transistor paired therewith remains in an erased state with a relatively low threshold level. The row address decoder unit 13 is responsive to row address bits, and allows one of the word lines WL1 to WLm to go up to active high voltage level so that a row of the first sub-array 12a and the row of the second sub-array 12b associated therewith are concurrently selected from the memory cell array 12. Then, data bits are read out from the row of the memory cell array 12.

The digit lines D1a to Dna are respectively associated with the columns of the n-channel enhancement type floating gate type field effect transistors MA11 to MAmn of the first sub-array 12a, and the digit lines D1b to Dnb are also associated with the columns of the n-channel enhancement type floating gate type field effect transistors MB11 to MBmn of the second sub-array 12b, respectively. The digit lines D1a to Dna are respectively paired with the digit lines D1b to Dnb so as to form digit line pairs, and, for this reason, a data bit read out from one of the non-volatile memory cells is propagated by the associated digit line pair in the form of differential voltage level.

The column selector unit 15 is coupled between the digit lines pairs and the sense amplifier unit 16, and is responsive to decoded signal lines DS1 to DSn so as to coupled one of the digit line pairs with the sense amplifier unit 16. An output data terminal OUT is driven by the sense amplifier unit 16, and an output data bit Dout indicative of a data bit memorized in the accessed non-volatile memory cell is generated at the output data terminal OUT.

Figure 4:
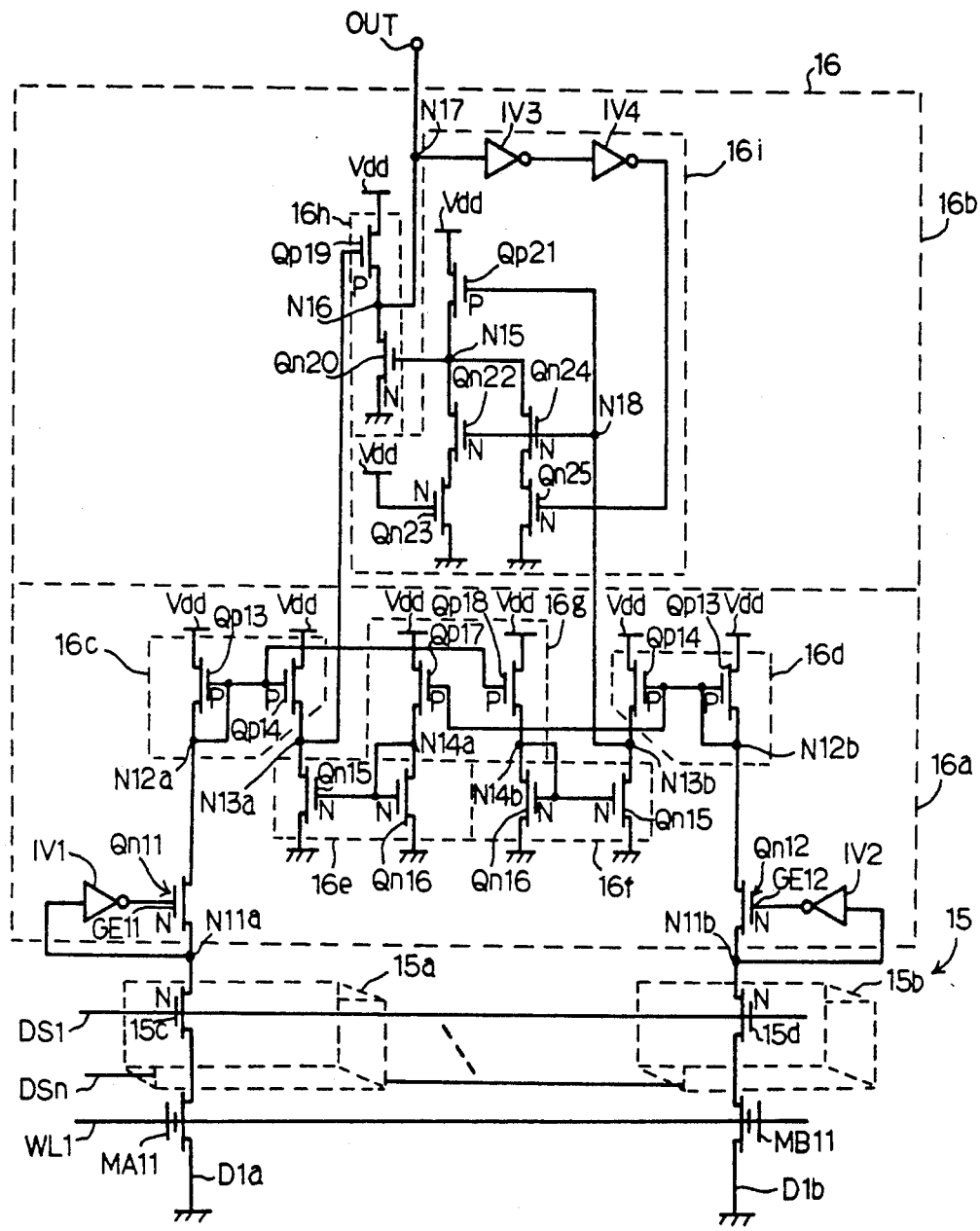
FIG. 4 is a circuit diagram showing the arrangement of a sense amplifier circuit incorporated in the semiconductor memory device shown in FIG. 3.

Turning to FIG. 4 of the drawings, the column selecting unit 15 is also broken down into first and second sections 15a and 15b, and the first and second sections 15a and 15b of the column selecting unit 15 are associated with the digit lines D1a to Dna and D1b to Dnb, respectively. The first section 15a of the column selecting unit 15 is implemented by n-channel enhancement type transfer transistors, and other n-channel enhancement type transfer transistors form in combination the second section 15b. The n-channel enhancement type transfer transistors of the first section 15a are coupled between the digit lines D1a to Dna and a first input node N11a of the sense amplifier unit 16, and the n-channel enhancement type transfer transistors of the second section 15b are coupled between a second input node N11b of the sense amplifier unit 16 and the digit lines D1b to Dnb. However, only one pair of n-channel enhancement type transfer transistors 15c and 15d are shown in FIG. 4 in association with the digit line pair D1a and D1b. The n-channel enhancement type transfer transistors of the first section 15a are respectively associated with the n-channel enhancement type transfer transistors of the second section 15b, and decoded signal lines DS1 to DSn are shared between the first and second sections 15a and 15b of the column selector unit 15. For this reason, when the column address decoder unit 14 drives one of the decoded signal lines DS1 to DSn, a pair of transfer transistors such as 15c and 15d concurrently turn on so as to couple the associated digit line pair with the first and second input nodes N11a and N11b of the sense amplifier unit 16, and a data bit on the digit line pair is relayed to the sense amplifier unit 16.

The sense amplifier circuit largely comprises a differential amplification stage 16a and an output stage 16b. The differential amplification stage 16a comprises a pair of n-channel enhancement type gate transistors Qn11 and Qn12 respectively coupled with the input nodes N11a and N11b, a pair of input inverters IV1 and IV2 coupled between the input nodes N11a and N11b and the gate electrodes GE11 and GE12 of the n-channel enhancement type gate transistors Qn11 and Qn12, a pair of first current mirror circuits 16c and 16d coupled between a power voltage line Vdd and the n-channel enhancement type gate transistors Qn11 and Qn12, a pair of second current mirror circuits 16e and 16f respectively associated with the pair of first current mirror circuits 16c and 16d, and an accelerating circuit 16g for promoting the function of the second current mirror circuits 16e and 16f.

Each of the first current mirror circuits 16c and 16d is implemented by a parallel combination of p-channel enhancement type field effect transistors Qp13 and Qp14. The p-channel enhancement type field effect transistor Qp13 is coupled between the power voltage line Vdd and the associated p-channel enhancement type field effect transistor Qn11 or Qn12, and the other p-channel enhancement type field effect transistor Qp14 is coupled between the power voltage line Vdd and the associated second current mirror circuit 16e. Since the gate electrodes of both p-channel enhancement type field effect transistors Qp13 and Qp14 are coupled with the drain node N12a or N12b of the p-channel enhancement type field effect transistor Qp13, currents passing through the p-channel enhancement type field effect transistors Qp13 and Qp14 are simultaneously regulated in accordance with the voltage level at the drain node N12a or N12b.

Each of the second current mirror circuits 16e and 16f is implemented by a parallel combination of n-channel enhancement type field effect transistors Qn15 and Qn16. The n-channel enhancement type field effect transistor Qn15 is coupled between the drain node N13a or N13b of the associated p-channel enhancement type field effect transistor Qp14 and a ground voltage line, and the n-channel enhancement type field effect transistor Qn16 is coupled between the accelerating circuit 16g and the ground voltage line. The gate electrodes of both n-channel enhancement type field effect transistors Qn15 and Qn16 are coupled with the drain node N14a or N14b of the n-channel enhancement type field effect transistor Qn16, and the voltage level at the drain node N14a or N14b simultaneously changes current passing through the p-channel enhancement type field effect transistors Qn15 and Qn16.

The accelerating circuit 16g is also implemented by a parallel combination of p-channel enhancement type field effect transistors Qp17 and Qp18 coupled between the power voltage line Vdd and the drain nodes N14a and N14b of the p-channel enhancement type field effect transistors Qn16. However, the gate electrodes of the p-channel enhancement type field effect transistors Qp17 and Qp18 are respectively coupled with the drain nodes N12b and N12a, and, for this reason, the accelerating circuit 16g supplies current to the second current mirror circuits 16e and 16f in opposite manner to the first current mirror circuits 16c and 16d.

The differential stage 16a thus arranged operates as follows. If the drain node N12a is higher in voltage level than the drain node N12b, the first current mirror circuit 16c decreases the current to the associated second current mirror circuit 16e, and the other first current mirror circuit 16d increases the current to the associated second current mirror circuit 16f. The accelerating circuit 16g supplies a high current to the second current mirror circuit 16e rather than the other second current mirror circuit 16f. Since the current from the first current mirror circuit 16c to the second current mirror circuit 16e is smaller than that from the first current mirror circuit 16d to the second current mirror circuit 16f, the voltage at the drain node N13a becomes lower than the drain node N13b. The increased current from the accelerating circuit 16g to the second current mirror circuit 16e increases the channel conductance of the n-channel enhancement type field effect transistor Qn15, and the n-channel enhancement type field effect transistor Qn15 promotes the voltage drop at the drain node N13a. On the other hand, the decreased current from the accelerating circuit 16g to the second current mirror circuit 16f decreases the channel conductance of the n-channel enhancement type field effect transistor Qn15, and the n-channel enhancement type field effect transistor Qn15 promotes the elevation at the drain node N13b. Thus, the pair of first current mirror circuits 16c and 16d develop the differential voltage between the drain nodes N12a and N12b in association with the pair of second current mirror circuits 16e and 16f, and the accelerating circuit 16g promotes the development of the differential voltage level.

The output stage 16b largely comprises an output inverter 16h and a controller associated with the output inverter 16h. The output inverter 16h is implemented by a series combination of a p-channel enhancement type field effect transistor Qp19 and an n-channel enhancement type field effect transistor Qn20 coupled between the power voltage line Vdd and the ground voltage line. The p-channel enhancement type field effect transistor Qp19 is gated by the drain node N13a, and the n-channel enhancement type field effect transistor Qn20 is gated by an output node N15 of the controller 16i. The common drain nodes of the enhancement type field effect transistors Qp19 and Qn20 is coupled with a data output terminal OUT as well as with a control node N17 of the controller 16i. The controller 16i further has an input node N18 which is coupled with the other drain node N13b. The controller 16i comprises a series combination of inverters IV3 and IV4, a p-channel enhancement type field effect transistor Qp21 coupled between the power voltage line Vdd and the output node N15, a series combination of n-channel enhancement type field effect transistors Qn22 and Qn23 coupled between the output node N15 and the ground voltage line, and a series combination of n-channel enhancement type field effect transistors Qn24 and Qn25 coupled between the output node N15 and the ground voltage line. The p-channel enhancement type field effect transistor Qp21 and the n-channel enhancement type field effect transistors Qn22 and Qn24 are gated by the input node N18 of the controller 16i, and the n-channel enhancement type field effect transistor Qn25 is gated by the inverter IV4. The gate electrode of the n-channel enhancement type field effect transistor Qn23 is coupled with the power voltage line Vdd, and, accordingly, the n-channel enhancement type field effect transistor Qn23 serves as a load element. In this instance, the n-channel enhancement type field effect transistor Qn23 is much larger in current driving capability than the n-channel enhancement type field effect transistor Qn22, and the n-channel enhancement type field effect transistor Qn22 is smaller in current driving capability than the p-channel enhancement type field effect transistor Qp21. The n-channel enhancement type field effect transistor Qn25 is much larger in current driving capability than the n-channel enhancement type field effect transistor Qn24 which in turn is larger in current driving capability than the p-channel enhancement type field effect transistor Qp21. However, it may be acceptable that the total current driving capability of the n-channel enhancement type field effect transistors Qn22 and Qn24 is larger than the p-channel enhancement type field effect transistor Qp21.

The controller 16i thus arranged behaves as an inverter with a variable threshold level. Namely, if the output data signal Dout is in logic "0" level corresponding to the low voltage level, the n-channel enhancement type field effect transistor Qn25 turns off, and the series combination of the enhancement type field effect transistors Qp21, Qn22 and Qn23 provides only one current path between the power voltage line Vdd and the ground voltage line. In these circumstances, when the input node N18 is stepped down to a intermediate voltage level, the output node N15 is only slightly decayed, and is closer to the high voltage level than the input node N18. On the other hand, if the output data signal Dout is in logic "1" level corresponding to the high voltage level, the n-channel enhancement type field effect transistor Qn25 turns on, and the current from the p-channel enhancement type field effect transistor Qp21 is branched and distributed to the two n-channel enhancement type field effect transistors Qn22 and Qn24. In these circumstances, if the input node N18 is moved to the intermediate voltage level, the output node N15 is lower than the intermediate voltage level, and is closer to the low voltage level. Thus, the controller 16i modifies the voltage level at the input node N18, and modified voltage level takes place at the output node N15. The current driving capability of the n-channel enhancement type field effect transistor Qn20 is variable depending upon the voltage level at the output node N15, and, accordingly, the output inverter 16h is variable in threshold level.

Figure 5:
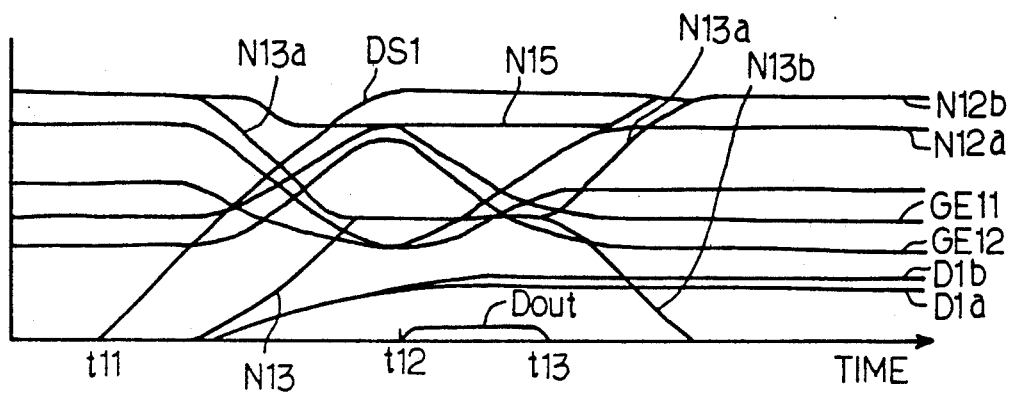
FIG. 5 is a diagram showing the waveforms at essential nodes of the semiconductor memory device upon access to a non-volatile memory cell storing a data bit.

Description is hereinbelow made on the circuit behavior with reference to FIGS. 5 and 6. Assuming now that a previously accessed data bit is identical in logic level with a currently accessed data bit represented by the n-channel enhancement type floating gate type field effect transistor MA11 in the erased state and the n-channel enhancement type floating gate type field effect transistor MB11 in the programmed state, the decoded signal line DS1 starts on rising at time t11. While the column selector unit 15 changes digit line pair coupled with the input nodes N11a and N11b, the drain nodes N12a is balanced with the drain node N12b, and, accordingly, the pair of first current mirror circuits 16c and 16d balance the drain nodes N13a and N13b with each other. However, the previous accessed data bit of logic "0" level allows the n-channel enhancement type field effect transistor Qn25 to turn off, and the output node N15 is kept higher than the input node N18 or the drain node N13b of the intermediate voltage level. Therefore, the n-channel enhancement type field effect transistor Qn20 is increased in current driving capability rather than the p-channel enhancement type field effect transistor Qp19, and the output data signal Dout slightly lifted from t12 and t13. In other words, any undesirable transient pulse takes place at the output data terminal OUT, and an semiconductor integrated circuit coupled therewith is prevented from malfunction. After differential voltage level takes place between the input nodes N11a and N11b, the n-channel enhancement type gate transistor Qn11 is continuously turned on, and the n-channel enhancement type gate transistor Qn12 turns off. As a result, the drain node N12a becomes lower than the drain node N12b, and the first current mirror circuit 16c increases current to the associated second current mirror circuit 16e. However, the first current mirror circuit 16d decreases current to the associated second current mirror circuit 16f. Then, the drain node N13a becomes higher than the drain node N13b, and the accelerating circuit 16g promotes the development. The high voltage level at the drain node N13a keeps the p-channel enhancement type field effect transistor Qp19 off, and the low voltage level at the drain node N13b allows the p-channel enhancement type field effect transistor Qp21 to turn on. However, the drain node N13b of the low voltage level shifts the n-channel enhancement type field effect transistor Qn22 to the off-state. Then, the output node N15 is elevated to the high voltage level, and the n-channel enhancement type field effect transistor Qn20 fully turns on. This results in the output data signal Dout of the low voltage level.

Figure 6:
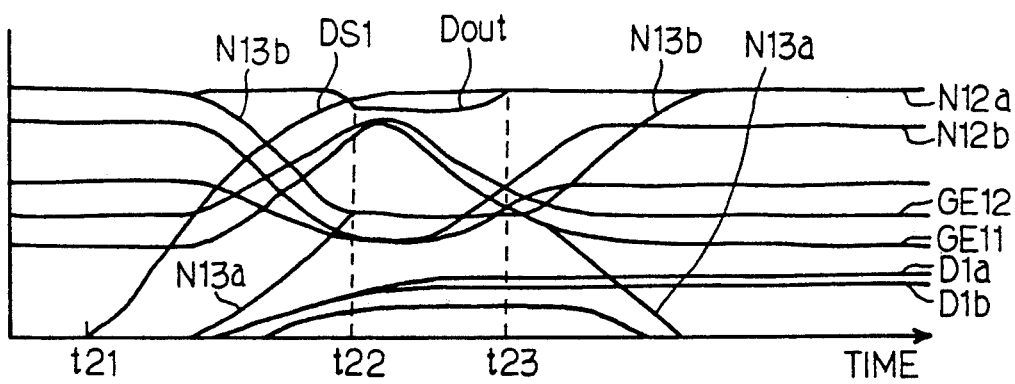
FIG. 6 is a diagram showing the waveforms at the essential nodes of the semiconductor memory device upon access to another non-volatile memory cell storing a data bit opposite in logic level to that shown in FIG. 5.

If a previously accessed data bit is identical in logic level with a currently accessed data bit represented by the n-channel enhancement type floating gate type field effect transistor MA11 in the programmed state and the n-channel enhancement type floating gate type field effect transistor MB11 in the erased state, the previously accessed data bit causes the output data terminal OUT to be in the high voltage level, and the decoded signal line DS1 starts on rising at time t21 as shown in FIG. 6. While the column selector unit 15 transiently changes digit line pair coupled with the input nodes N11a and N11b, the drain nodes N12a is balanced with the drain node N12b, and the pair of first current mirror circuits 16c and 16d balance the drain nodes N13a and N13b with each other. However, the previous accessed data bit of logic "1" level allows the n-channel enhancement type field effect transistor Qn25 to turn on, and the output node N15 is kept lower than the input node N18 or the drain node N13b of the intermediate voltage level. Therefore, the n-channel enhancement type field effect transistor Qn20 is increased in channel resistance, and only negligible amount of current flows through the n-channel enhancement type field effect transistor Qn20. As a result, the output data signal Dout is slightly decayed from t22 and t23; however, any undesirable transient pulse takes place at the output data terminal OUT. For this reason, an semiconductor integrated circuit coupled therewith is prevented from malfunction. After differential voltage level takes place between the input nodes N11a and N11b, the n-channel enhancement type gate transistor Qn12 turns on, and the n-channel enhancement type gate transistor Qn11 is turned off. The drain node N12a becomes higher than the drain node N12b, and the first current mirror circuit 16c decreases current to the associated second current mirror circuit 16e. However, the first current mirror circuit 16d increases current to the associated second current mirror circuit 16f. Then, the drain node N13a becomes lower than the drain node N13b, and the accelerating circuit 16g promotes the development. The low voltage level at the drain node N13a keeps the p-channel enhancement type field effect transistor Qp19 on, and the high voltage level at the drain node N13b allows the p-channel enhancement type field effect transistor Qp21 to turn off. However, the drain node N13b of the low voltage level shifts the n-channel enhancement type field effect transistor Qn22 to the on-state. Then, the output node N15 is decayed to the low voltage level, and the n-channel enhancement type field effect transistor Qn20 fully turns off. Since the low voltage level at the drain node N13a allows the p-channel enhancement type field effect transistor Qp19 to fully turn on, the output data signal Dout is elevated to the high voltage level again.

As will be understood from the foregoing description, the controller 16i changes the threshold level of the output inverter 16h, and any transient pulse never takes place at the output data terminal OUT while the input nodes N11a and N11b are transiently balanced with each other. This results in that a semiconductor integrated circuit coupled therewith is free from any malfunction due to the transient pulse.

Although particular embodiments of the present invention have been shown and described, it will be obvious to those skilled in the art that various changes and modifications may be made without departing from the spirit and scope of the present invention. For example, the sense amplifier unit according to the present invention is available in any kind of semiconductor memory device supplying a data bit in the form of differential voltage level thereto, and the differential amplifier stage may have a different circuit configuration.

What is claimed is:

1. A semiconductor memory device comprising:
   a) a memory cell array for storing a plurality of data bits;
   b) a selecting means associated with said memory cell array, and supplying one of said plurality of data bits to output ports thereof in the form of differential voltage level; and
   c) a sense amplifier unit having c-1) a differential amplification stage operative to develop a differential voltage level indicative of said one of said plurality of data bits for producing a large differential voltage signal, and c-2) an output stage having an output inverter with a variable threshold level, said output inverter being responsive to said large differential voltage signal for producing an output data signal at an output data node, and a controller responsive to said output data signal which is indicative of a previously accessed data bit for changing the threshold level of said output inverter, said controller having a temporary data storage means coupled with said output data node for storing said output data signal which is indicative of said previously accessed data bit, a control node coupled with said output inverter and producing a control voltage signal for changing said threshold level of said output inverter and a variable resistor means for changing said control voltage signal depending upon the logical level of said output data signal stored in said temporary data storage means.

2. A semiconductor memory device as set forth in claim 1, in which said memory cell array comprises a-1) a plurality of first floating gate type field effect transistors, and a-2) a plurality of second floating gate type field effect transistors respectively paired with said plurality of first floating gate type field effect transistors for forming a plurality of memory cells respectively storing said plurality of data bits.

3. A semiconductor memory device as set forth in claim 1, in which said selecting means comprises b-1) a plurality of word lines for selecting a row of memory cells selected from said plurality of memory cells, b-2) a plurality of bit line pairs respectively coupled with columns of memory cells for propagating data bits read out from the selected row of said memory cells in the form of differential voltage level, and b-3) a column selector unit for coupling one of said plurality of digit line pairs to said output ports.

4. An electrically programmable read only memory device fabricated on a single semiconductor chip, comprising:
   a) a memory cell array having a-1) a first sub-array implemented by a plurality of first floating gate type field effect transistors arranged in sub-rows and columns, and a-2) a second sub-array implemented by a plurality of second floating gate type field effect transistors arranged in sub-rows and columns, and respectively paired with said plurality of first floating gate type field effect transistors for forming a plurality of memory cells arranged in matrix and respectively storing data bits;
   b) a plurality of word lines each coupled with one of said sub-rows of said first sub-array and one of said sub-rows of said second sub-array, and selectively driven to active level for reading out data bits from a row of memory cells;
   c) a plurality of first digit lines respectively coupled with the columns of said first sub-array;
   d) a plurality of second digit lines respectively coupled with the columns of said second sub-array, and respectively paired with said plurality of first digit lines for forming a plurality of digit line pairs, said data bits read out from the row of memory cells being propagated by said plurality of digit line pairs in the form of differential voltage level;
   e) a column selector unit coupled with said plurality of digit line pairs for selectively coupling with a pair of output nodes thereof; and
   f) a sense amplifier unit comprising f-1) a differential amplification stage including a pair of gate transistors having respective conductive paths respectively coupled with said pair of output nodes of said column selector unit, a pair of input inverters having respective input nodes coupled with said pair of output nodes for controlling resistances of said conductive paths of said pair of gate transistors, a pair of first current mirror circuits respectively coupled with the conductive paths of said pair gate transistors, and second current mirror circuits supplied with currents from said pair of first current mirror circuits for producing a large differential voltage signal, and f-2) an output stage including an output inverter implemented by a series combination of first and second transistors opposite in channel conductivity type to each other and producing an output data signal, and a controller responsive to said output data signal indicative of a previously accessed data bit and varying a voltage level forming a part of said large differential voltage signal for producing modified voltage level, said first transistor being responsive to a voltage level forming the other part of said large differential voltage signal, said second transistor being responsive to said modified voltage level.

5. A semiconductor memory device comprising:
   a) a memory cell array for storing a plurality of data bits;
   b) a selecting means associated with said memory cell array, for supplying one of said plurality of data bits to output ports thereof in the form of differential voltage level; and
   c) a sense amplifier unit having c-1) a differential amplification stage operative to develop a differential voltage level indicative of said one of said plurality of data bits for producing a large differential voltage signal, and comprising a pair of gate transistors having respective input nodes coupled with said output ports for controlling resistance of said conductive paths of said pair of gate transistors, a pair of first current mirror circuits respectively coupled with the conductive paths of said pair of gate transistors, a pair of second current mirror circuits supplied with currents from said pair of first current mirror circuits for producing said large differential voltage signal, and an accelerating circuit associated with said pair of second current mirror circuits and responsive to voltage levels at the input nodes of said pair of first current mirror circuits for promoting development of said large differential voltage signal, and c-2) an output stage having an output inverter with a variable in threshold level, said output inverter being responsive to said large differential voltage signal for producing an output data signal, and a controller responsive to said output data signal, which is indicative of a previously accessed data bit, for changing the threshold level of said output inverter.

6. A semiconductor memory device as set forth in claim 5, in which said output inverter is implemented by a series combination of first and second transistors coupled between first and second sources of voltage level and opposite in channel conductivity type to each other for producing said output data signal, and in which said controller is responsive to said output data signal indicative of said previously accessed data bit and varies a voltage level forming a part of said large differential voltage signal for producing modified voltage level, said first transistor being responsive to a voltage level forming the other part of said large differential voltage signal, said second transistor being responsive to said modified voltage level.

7. A semiconductor memory device as set forth in claim 6, in which said controller comprises a series combination of inverters supplied with said output data signal for producing a control signal, a third transistor of a first channel conductivity type coupled between said first source of voltage level and an output node of said controller, a series combination of fourth and fifth transistors of a second channel conductivity type coupled between said output node of said controller and said second source of voltage level, and a series combination of sixth and seventh transistors of said second channel conductivity type coupled between said output node of said controller and said second source of voltage level, said third, fourth and sixth transistors being gated by said voltage level forming the other part of said large differential voltage signal, said fifth transistor having a gate electrode coupled with said first source of voltage level, said seventh transistor being gated by said control signal.

8. A semiconductor memory device as set forth in claim 7, in which said fifth and seventh transistors are respectively larger in current driving capability than said fourth and sixth transistors, said fourth transistor being smaller in current driving capability than said third transistor, the total current driving capability of said fourth and sixth transistors being larger than that of said third transistor.

* * * * *